May 12, 1970 ATSUSHI OHWADA 3,512,099

SEMICONDUCTOR AMPLIFIER WHEREIN SEVERAL METAL OXIDE SEMICONDUCTOR FIELD EFFECT TRANSISTORS ARE COUPLED ON A SUBSTRATE

Filed Sept. 23, 1968 3 Sheets-Sheet 1

Atsushi Ohwada

INVENTOR.

BY George B. Oujevolk

Attorney

Atsushi Ohwada
INVENTOR.
BY
Attorney

Atsushi Ohwada
*INVENTOR.*

BY George B. Oujevolk
Attorney

United States Patent Office 3,512,099

Patented May 12, 1970

3,512,099

SEMICONDUCTOR AMPLIFIER WHEREIN SEVERAL METAL OXIDE SEMICONDUCTOR FIELD EFFECT TRANSISTORS ARE COUPLED ON A SUBSTRATE

Atsushi Ohwada, Kawasaki-shi, Japan, assignor to Tokyo Shibaura Electric Co., Ltd., Kawasaki-shi, Japan, a corporation of Japan Filed Sept. 23, 1968, Ser. No. 761,667
Claims priority, application Japan, Sept. 28, 1967, 42/61,950; Sept. 14, 1968, 43/65,980
Int. Cl. H03f 3/16, 3/68, 3/14
U.S. Cl. 330—35 8 Claims

ABSTRACT OF THE DISCLOSURE

A semiconductor amplifier having a depletion mode MOS-FET unit disposed at the first stage and an enhancement mode MOS-FET unit positioned at the last stage, both of which are formed in the same semiconductor substrate. The drain electrode of the first stage MOS-FET unit and the gate electrode of the last stage MOS-FET unit are directly coupled so as to have the same potential.

The present invention relates to a semiconductor amplifier formed by directly coupling a plurality of MOS-FET units (metal oxide semiconductor field effect transistors) on the surface of the same semiconductor substrate.

Hitherto, a two-step amplifier, wherein a transistor element at the first stage and that at the last stage are directly coupled with each other, has been deemed convenient for the miniaturization and simplification of an amplifier. However, where the amplifier was composed of these transistor elements, it was impossible to obtain a compact semiconductor amplifier having good amplifying properties, even though the elements were directly coupled. Namely, in the case of direct coupling, the emitter lead of the first stage transistor and the base lead of the last stage transistor were directly coupled with each other. Accordingly, where the last stage transistor consisted of a bipolar type, the base-emitter bias voltage thereof had the same potential as the emitter-collector bias voltage of the first stage transistor, so that the bias voltage of the last stage transistor was too much elevated for use in an amplifier. Also it may be contemplated to use a junction type FET (J-type FET) unit at the last stage. In this case, however, the J-type FET unit which is only impressed with a depletion bias voltage is unsuitable, because the directly coupled last stage elements are also unavoidably supplid with an enhancement bias voltage.

The semiconductor amplifier of the present invention comprises one depletion mode MOS-FET unit and at least one enhancement mode MOS-FET unit. The depletion mode transistor is disposed at the first stage and the enhancement mode MOS-FET unit at the last stage. These MOS-FET units are directly coupled in such a manner that the drain electrode of the first stage unit and the gate electrode of the last stage unit have the same potential. The aforementioned mode of the MOS-FET units are determined by their different resistivities in a semiconductor substrate, thus enabling the amplifier to display good amplifying properties and also permitting the simplification and miniaturization of the entire apparatus.

It is accordingly the object of the present invention to provide a semiconductor amplifier which can exhibit good amplifying properties and permits the simplification and miniaturization of the entire apparatus.

In an aspect of the invention, the semiconductor amplifier is characterized in that it comprises one semiconductor substrate consisting of one region of high specific resistivity and at least one region of low specific resistivity, one first stage metal oxide semiconductor field effect transistor formed in the region of high specific resistivity and fixed at a depletion mode by the high specific resistivity and at least one last stage metal oxide semiconductor field effect transistor formed in the region of low specific resistivity and fixed at an enhancement mode by the low specific resistivity, all the pairs of transistors being directly coupled with each other and the drain electrode of the depletion mode transistor and the gate electrodes of the enhancement mode transistors being directly coupled so as to have the same potential.

In another aspect of the invention, the semiconductor amplifier is characterized in that it comprises one semiconductor substrate consisting of one region of high specific resistivity and at least one region of low specific resistivity, a pair of differentially coupled first stage MOS-FET units formed in the region of high specific resistivity and respectively fixed at a depletion mode by the high specific resistivity and at least one pair of differentially coupled last stage MOS-FET units formed in the region of low specific resistivity and respectively fixed at an enhancement mode by the low specific resistivity, these pairs of transistors being directly coupled with each other and the drain electrode of the depletion mode transistor and the gate electrodes of the enhancement mode transistors being directly coupled so as to have the same potential.

The present invention can be more fully understood from the following description when taken in connection with reference to the accompanying drawings, in which.

There will now be given the reason why the semiconductor amplifier of the present invention has a depletion mode MOS-FET unit at the first stage and an enhancement mode MOS-FET unit at the last stage.

Of MOS-FET units, those wherein a drain current flows when the gate bias voltage is zero, are designated as a depletion type and those wherein said drain current does not run at that time, are denoted as an enhancement type. Further, a depletion type transistor is classified into an enhancement mode MOS-FET unit used in a region where the drain current has a larger value than its current $I_D$ at the time of $V_G$=O and a depletion mode MOS-FET unit employed in a region where the drain current has a smaller value than said current $I_D$.

Accordingly, when the enhancement mode MOS-FET unit is used at the last stage, the gate bias voltage thereof is only required to lie between the source voltage and drain voltage. Since the threshold voltage can be controlled to about 0.5 to 5 volts, the arrangement of the bias circuit and consequently the entire apparatus is simplified.

There will now be given the reason for selecting a depletion mode MOS-FET unit as a first stage element. As previously mentioned, the last stage element is a MOS-FET unit, so that if the first stage transistor also consists of a MOS-FET type, it will be possible to form both first and last stage elements on one semiconductor substrate at the same time as in an integrated circuit, affording convenience in manufacture and also permitting the miniaturization of an amplifier itself. However, where a bipolar transistor is used as a first stage element to obtain good amplifying properties, it will be necessary to employ what is known as a lateral type which is formed by providing an emitter and collector region on one side of the substrate, and electrically insulate the first and last stage elements, resulting in a complicated construction and consequently increasing difficulties in manufacture. As described above, however, selection of a depletion mode MOS-FET unit as the first stage element affords much convenience in amplification, because inputs to this element have a high inductance. For the aforementioned reason, the present invention involves a depletion mode MOS-FET unit as a first stage element and an enhancement mode MOS-FET unit as a last stage element.

The inventor has also found by the following experimental work that it is easy to form MOS-FET units of different modes on the same semiconductor substrate.

Figure 1:
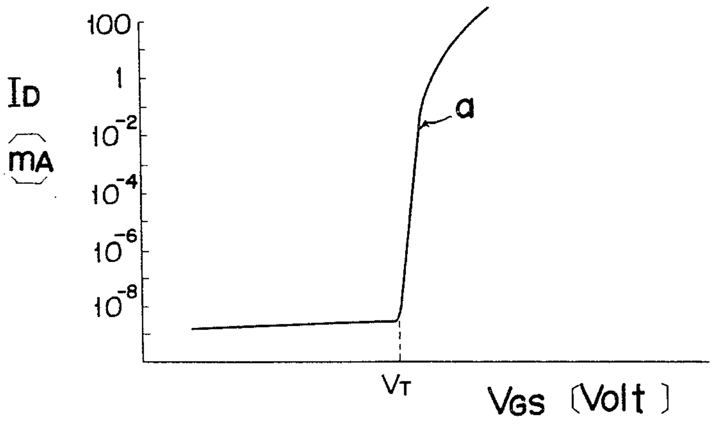
FIG. 1 is a curve diagram of the $I_D$–$V_{GS}$ properties of a MOS-FET unit.
Figure 2:
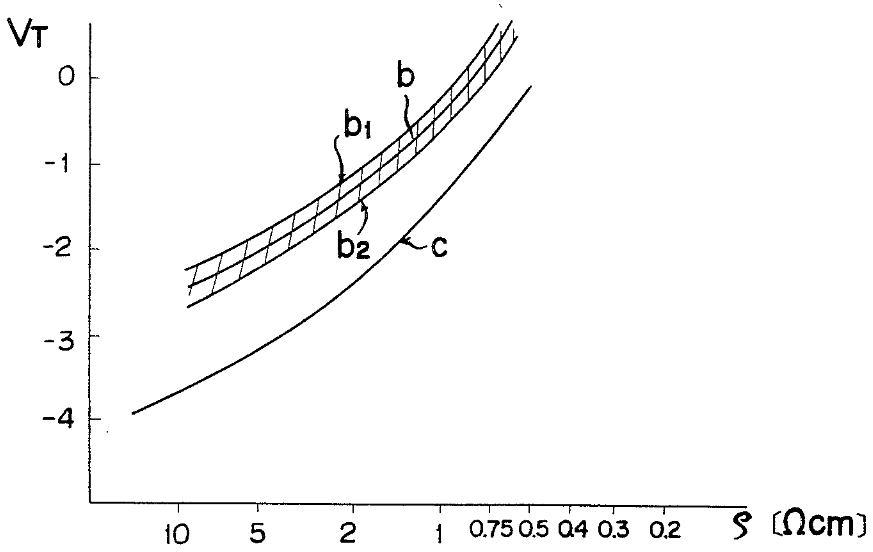
FIG. 2 is a curve diagram showing the dependency of a MOS-FET unit on the specific resistivity of the semiconductor substrate.

As shown by the curve *a* of FIG. 1, the drain current $I_D$ of a MOS-FET element prepared from a P-type silicon wafer whose top face consisted of a 100 face changed with the voltage $V_{GS}$ across the source-gate thereof. At a certain level $V_T$ of said voltage $V_{GS}$ the drain current $I_D$ rapidly increased. Next, determination was made of variations in the aforesaid voltage $V_T$ when the specific resistivity of the MOS-FET substrate was varied progressively. The results are indicated by the curve *b* of FIG. 2. The curves $b_1$ and $b_2$ represent variations in the upper and lower limits respectively of experimental values. As seen from the curve *b*, the value of the voltage $V_T$ depended on the magnitude of specific resistivity of a semiconductor substrate. The pattern of this dependency substantially accorded with that of the curve *c* representing the theoretical values determined from the gate bias voltage supplying the minimum value of a cure denoting the current-voltage properties in the low frequency limit of a MOS type varactor. Namely, the curve indicating the voltage $V_T$ changed its curvature starting from the border region where the specific resistivity $\rho$ of the substrate showed approximately 0.75Ω cm. It is seen from this fact that when the specific resistivity $\rho$ was larger than about 0.75Ω cm. the voltage $V_T$ was positive to form a depletion mode MOS-FET unit and when the specific resistivity $\rho$ was smaller than about 0.75Ω cm. the voltage $V_T$ was negative to form an enhancement mode MOS-FET unit. Thus the apparatus of the present invention is characterized in that it comprises an enhancement mode MOS-FET unit formed in a region of low specific resistivity in a semiconductor substrate and a depletion mode MOS-FET unit formed in a region of high specific resistivity in said substrate.

Figure 3:
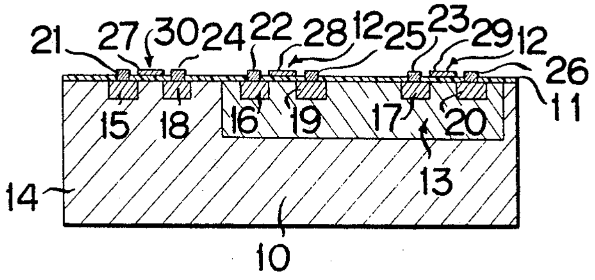
FIG. 3 is a cross section of a semiconductor amplifier according to an embodiment of the present invention.
Figure 4:
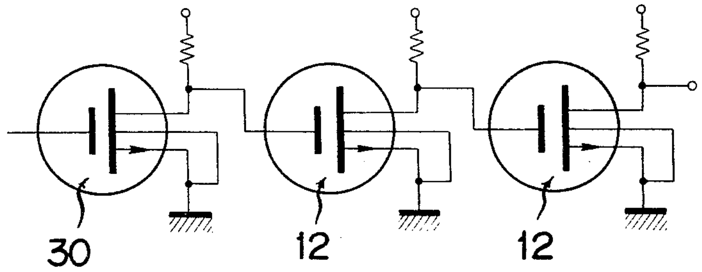
FIG. 4 is a circuit diagram of the apparatus of FIG. 3.
Figure 5:
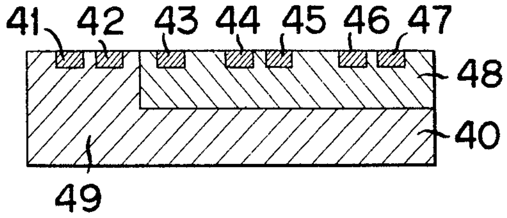
FIG. 5 is a cross section of a differential semiconductor amplifier according to another embodiment of the invention.

There will now be described an embodiment of the present invention by reference to FIGS. 3 and 4.

A P-conductivity type silicon substrate 10 whose top face consisted of a 100 face and whose resistivity was 8 to 20Ω cm. (concentration of acceptor impurities: $10^{15}$ atoms $cm.^{-3}$) was heated about 60 minutes at a temperature of 1,100° C. in a wet atmosphere consisting of oxygen and steam generated by the bubbling of water at a temperature of about 85° C. On the surface of the substrate was initially formed a silicon oxide film 11 about 4,000 A. thick for use as a diffusion mask. The specified portion of the diffusion mask 11 on the surface of the substrate was removed by the known photoetching process using a KPR solution. In the exposed area were formed two enhancement mode MOS-FET units 12. Into that part 13 of the substrate from which the oxide silicon film 11 was removed by the aforesaid photoetching process, were diffused acceptor impurities to such extent that the concentration thereof on the surface of the exposed area 13 was 2 to $5\times10^{16}$ cm. $^{-3}$ and the thickness thereof was more than 3$\mu$, in order to reduce the resistivity of the exposed area 13 to less than 0.75Ω cm. The diffusion of acceptor impurities was performed, for example, by diffusing trimethyl borate carried by nitrogen gas for 15 minutes at a temperature of 950° C. to produce a region 13 of low resistivity. The boron glass formed on the surface of the substrate during diffusion was removed and thereafter the substrate was heated 6 hours in an oxygen atmosphere at a temperature of 1,200° C. to increase the thickness of the region of diffused boron. On the surface of the boron region was again formed a silicon oxide film 11. In the prescribed areas of the silicon oxide film, namely, on the surface of the low resistivity region and on the surface of the high resistivity region were bored two pairs and one pair of apertures respectively. Through these apertures was diffused phosphoric acid carried by oxygen gas 30 minutes at a temperature of 1,000° C. to form source areas 15, 16 and 17 and drain areas 18, 19 and 20. Thereafter all the silicon oxide film 11 on the surface of the substrate 10 was removed by the photoetching process using a solution of hydrofluoric acid. The substrate was treated 2 hours with dry oxygen gas at a temperature of 1,100° C. to form a fresh silicon oxide film 11, 1,500 to 2,000 A. thick on the surface thereof. And there were mounted according to the customary practice source electrodes 21, 22 and 23 on the source regions, drain electrodes 24, 25 and 26 on the drain regions and gate electrodes 27, 28 and 29 on the silicon oxide films between the source electrodes 21, 22 and 23 and drain electrodes, 24, 25 and 26. The semiconductor apparatus thus formed contains, as shown in FIG. 3, two enhancement mode MOS-FET units 12 in the low resistivity region 13 of the substrate 10 and one depletion mode MOS-FET unit 30 in the high resistivity region 14. As seen from the circuit diagram of FIG. 4, the drain electrode of the depletion mode MOS-FET unit 30 used as a first stage element and the gate electrode of the first enhancement mode MOS-FET unit 12 used as a last stage element are directly coupled without any load therebetween so as to have an equal potential. The second enhancement mode MOS-FET unit 12 at the last stage is directly coupled with the first one. The aforementioned embodiment used two enhancement mode MOS-FET units at the last stage. However, the number of said units is not limited to two, but may consist of any others. Also the P-type semiconductor substrate used in the embodiment may be replaced by an N-type. Further, the top face of the silicon wafer is not limited to a 100 face, but may consist of any other faces.

Figure 6:
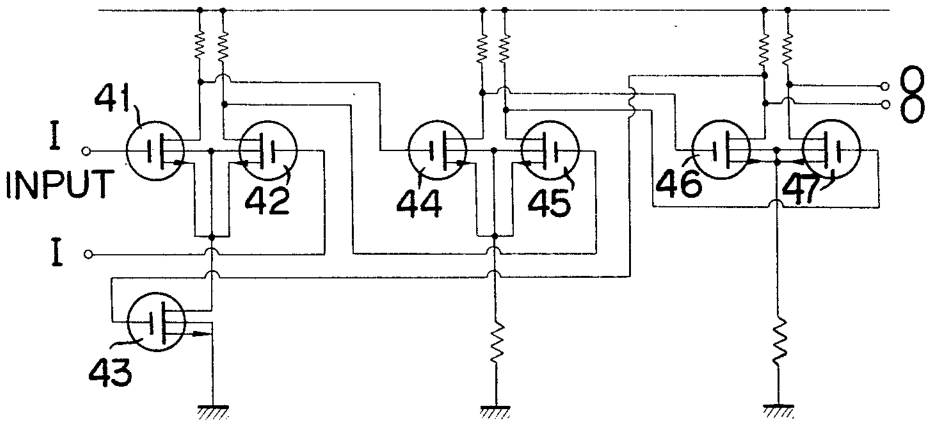
FIG. 6 is a circuit diagram of the amplifier of FIG. 5.

There will now be described the case where the semiconductor apparatus of the present invention is applied in a differential amplifier. The method of manufacturing this apparatus and the detailed interior arrangement of a transistor are substantially the same as those of the foregoing embodiment and description thereof is omitted. On the semiconductor substrate 40 are formed seven MOS-FET units, namely, a pair of depletion mode MOS-FET units 41 and 42, one enhancement mode MOS-FET unit 43 and two pairs of enhancement mode MOS-FET units 44–45 and 46–47. As in the aforesaid embodiment, the modes of MOS-FET units are determined according to whether they are formed in a region of low resistivity 48 of the semiconductor substrate or a region of high resistivity 49. These transistors are connected as shown in FIG. 6. Input terminals I—I are connected to the gate electrodes of the depletion mode MOS-FET units 41 and 42 respectively. These transistors 41 and 42 are differentially coupled. Also the component members of each of the two pairs 44–45 and 46–47 of enhancement mode MOS-FET units are differentially coupled. Further, the respective pairs 41–42, 44–45 and 46–47 are directly coupled with each other. The enhancement mode MOS-FET unit 43 is provided to adjust the bias voltage. The drain electrode of this element is connected to the source of the first stage transistors 41 and 42 and one of the gate electrodes of said element to the output terminal O directly coupled with the drain electrode of the last stage element 46.

In the foregoing embodiment, the enhancement mode transistors were all formed in one region of low resistivity. However, an independent region may be provided for each group of these transistors. Further, the number of the groups is not limited to two, but is only required to be larger than at least one.

In the semiconductor amplifier of the present invention, one semiconductor substrate is divided into a region of high resistivity and a region of low resistivity, and the MOS-FET units formed therein are separated into a depletion mode and an enhancement mode due to the different resistivities of the regions. Further, the groups of transistors are directly coupled with each other, with the depletion mode transistor used as a first stage element. Accordingly, the present amplifier has a good amplifying effect and permits miniaturization due to its simple construction.

What is claimed is:

1. A semiconductor amplifier comprising one semiconductor substrate consisting of one region of high resistivity and at least one region of low resistivity, one first stage metal oxide semiconductor field effect transistor formed in the region of high resistivity and fixed at a depletion mode by the high resistivity and at least one last stage metal oxide semiconductor field effect transistor formed in the region of low resistivity and fixed at an enhancement mode by the low specific resistivity, all the pairs of transistors being directly coupled with each other and the drain electrode of the depletion mode transistor and the gate electrode of the enhancement mode transistor being directly coupled so as to have the same potential.

2. A semiconductor amplifier according to claim 1 wherein the semiconductor substrate is of a P-conductivity type.

3. A semiconductor amplifier according to claim 1 wherein the semiconductor substrate comprises a region of high resistivity having a resistivity of about 0.75Ω cm. minimum and a region of low resistivity having a resistivity of about 0.75Ω cm. maximum.

4. A semiconductor amplifier comprising one semiconductor substrate consisting of one region of high resistivity and at least one region of low resistivity, a pair of differentially coupled first stage metal oxide semiconductor field effect transistors formed in the region of high resistivity and respectivily fixed at a depletion mode by the high resistivity and at least one pair of differentially coupled last stage metal oxide semiconductor field effect transistors formed in the region of low resistivity and respectively fixed at an enhancement mode by the low resistivity, these pairs of transistors being directly coupled with each other and the drain electrode of the depletion mode transistors and the gate electrodes of the enhancement mode transistors being directly coupled so as to have the same potential.

5. A semiconductor amplifier according to claim 4 wherein the semiconductor substrate is of a P-conductivity type.

6. A semiconductor amplifier according to claim 4 wherein the semiconductor substrate comprises a region of high specific resistivity having a specific resistivity of about 0.75Ω cm. minimum and a region of low specific resistivity having a specific resistivity of about 0.75Ω cm. maximum.

7. A semiconductor amplifier according to claim 2 wherein the semiconductor substrate comprises a region of high resistivity having a resistivity of about 0.75Ω cm. minimum and a region of low resistivity having a resistivity of about 0.75Ω cm. maximum.

8. A semiconductor amplifier according to claim 5 wherein the semiconductor substrate comprises a region of high specific resistivity having a specific resistivity of about 0.75Ω cm. minimum and a region of low specific resistivity having a specific resistivity of about 0.75Ω cm. maximum.

References Cited

Lehman et al., "Formation of Depletion and Enhancement Mode Field Effect Transistors," IBM Technical Disclosure Bulletin, vol. 8, No. 4, September 1965, pp. 675–676.

ROY LAKE, Primary Examiner

J. B. MULLINS, Assistant Examiner

U.S. Cl. X.R.

330—30, 38